United States Patent
Takasu et al.

[11] Patent Number: 4,914,490
[45] Date of Patent: Apr. 3, 1990

[54] NON-SINGLE CRYSTAL ELECTROLUMINESCENT DEVICE

[75] Inventors: Katsuji Takasu; Masafumi Sano; Hisanori Tsuda, all of Atsugi; Yutaka Hirai, Tokyo, all of Japan

[73] Assignee: Canon Kabushiki Kaisha, Tokyo, Japan

[21] Appl. No.: 303,032

[22] Filed: Jan. 30, 1989

Related U.S. Application Data

[63] Continuation of Ser. No. 900,745, Aug. 27, 1986, abandoned.

[30] Foreign Application Priority Data

| Aug. 28, 1985 | [JP] | Japan | 60-189274 |
| Aug. 30, 1985 | [JP] | Japan | 60-191422 |
| Sep. 3, 1985 | [JP] | Japan | 60-195083 |
| Sep. 3, 1985 | [JP] | Japan | 60-195084 |
| Sep. 5, 1985 | [JP] | Japan | 60-197449 |
| Sep. 20, 1985 | [JP] | Japan | 60-209331 |
| Sep. 21, 1985 | [JP] | Japan | 60-209338 |

[51] Int. Cl.$^4$ ............................................. H01L 33/00
[52] U.S. Cl. .................................. 357/17; 357/2; 357/4; 357/58
[58] Field of Search ................. 357/2, 4, 17, 58, 59

[56] References Cited

U.S. PATENT DOCUMENTS

| 4,069,492 | 1/1978 | Pankove et al. | 357/17 |
| 4,226,898 | 10/1980 | Ovshinsky et al. | 427/39 |
| 4,317,844 | 3/1982 | Carlson et al. | 427/39 |
| 4,527,179 | 7/1985 | Yamazaki | 357/17 |

Primary Examiner—William L. Sikes
Assistant Examiner—B. R. R. Nolloway
Attorney, Agent, or Firm—Fitzpatrick, Cella, Harper & Scinto

[57] ABSTRACT

A light emitting device has a luminescent layer having at least two layers of a non-single crystalline material containing silicon atoms, carbon atoms and hydrogen atoms laminated and having a homojunction, and at least a pair of electrodes connected electrically to said luminescent layer, the non-single crystalline silicon layer having an optical band gap of 2.0 eV or higher and a localized level density at mid-gap of $5 \times 10^{16}$ cm$^{-3} \cdot$eV$^{-1}$ or less.

23 Claims, 6 Drawing Sheets

NON-SINGLE CRYSTAL ELECTROLUMINESCENT DEVICE

This application is a continuation of application Ser. No. 900,745, filed Aug. 27, 1986, now abandoned.

BACKGROUND OF THE INVENTION

1. Field of the Invention

This invention relates to a light emitting device to be used for the light source or the display of OA instruments, etc.

2. Related Background Art

Heretofore, there have been reported various materials for constituting the light emitting layers of light emitting devices. Among them, non-single crystalline silicon containing hydrogen atoms (hereinafter written as "non-Si:H") as described in, for example, Appl. Phys. Lett. 29 (1976), PP. 620–622, J. I. Pankou, D. E. Carlson or Jpn. J. Appl. Phys 21 (1982) pp. 473–475, K. Takahashi et al is one of the materials which are attracting attention, because semiconductor engineering similarly as in the case of single crystalline silicon is applicable and also there is the possibility that some potential characteristics may be excellent, etc.

The constitution of the light emitting device in which the non-Si:H is used as the light emitting material described in the above cited references has a homo-junction having a P-type conductive layer containing a P-type impurity (P layer), a layer containing none of P-type and N-type impurities (non doped) layer and an N-type conductive layer containing an N-type impurity (N layer) laminated.

However, in the light emitting device reported in the prior art with such a constitution, no luminescence in the visible light region with sufficient luminescent quantity has been obtained. In addition, the luminescent intensity is weak with its life being short, and also stability of luminescent characteristics is lacking. Thus, there remain a large number of drawbacks to be improved. As one idea to improve the above drawbacks, there has been an attempt to obtain luminesence in the visible wavelength region by enlarging the optical band gap by addition of carbon atoms to non-Si:H, but practically problems still remain, and there has been obtained no material which can be industrialized for the light source device or the display device to be used in OA instruments, etc.

SUMMARY OF THE INVENTION

A principal object of the present invention is to provide a light emitting device which meets the problem of the prior art.

Another object of the present invention is to provide a light emitting device having sufficient luminescent quantity in the visible wavelength region which has been intended to improve luminescent efficiency and reproducibility.

Still another object of the present invention is to provide a light emitting device which has been dramatically improved in stability of luminescent characteristics and life.

DESCRIPTION OF PREFERRED EMBODIMENTS

Figure 1:
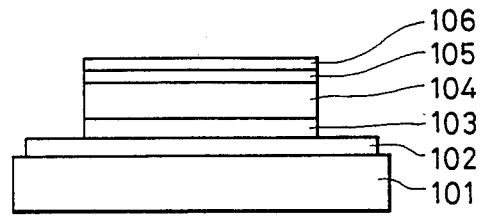
FIGS. 1 to 16 are each schematic illustration showing the layer consitution of preferred embodiments of the light emitting device of the present invention.

The present invention is described in detail by referring to the drawings.

FIG. 1 is a schematic illustration showing the layer constitution of a first preferred embodiment of the light emitting device of the present invention.

The light emitting device shown in FIG. 1 consists of a luminescent layer comprising a P-type conductive layer 103, an I-type conductive layer 104 and an N-type conductive layer 105 on an electrode 102 provided on a substrate 101 and an electrode 106 provided on the luminescent layer.

When the light emitting device shown in FIG. 1 is to be used as the planar light emitting device, the electrode 102 and/or the electrode 106 are required to be transparent if the color of the luminescent color is also utilized, and desired to be transmissive to the luminescent light if the luminescent quantity is to be utilized. When the luminescent light is to be taken out from the side of the electrode 102, the substrate 101 is desired to be transparent similarly as the electrode 102 or transmissive to the luminescent light.

In the light emitting device of the present invention, the luminescent layer is constituted of a non-single crystalline material containing silicon atoms (Si), carbon atoms (C) and hydrogen atoms (H) [hereinafter abbreviated as "non-SiC:H"].

The hydrogen atoms (H) contained in the luminescent layer compensate for free dangling bonds of silicon atoms, and its content is an important factor which influences semiconductor characteristics, structural stability, heat resistance of the layers formed and the luminescent characteristics and the stability of the device. In the present invention, the content of hydrogen atoms (H) may preferably be 0.1 to 40 atomic %, more preferably 0.5 to 35 atomic %, optimally 1 to 30 atomic % based on silicon atoms.

It is possible to control the luminescent peak wavelength and the luminescent intensity by selecting the ratio of silicon atoms (Si) to carbon atoms (C) suitably as desired. In the present invention, in terms of the value of X in $Si_xC_{1-x}$, it is preferably from 0.05 to 0.99, more preferably from 0.1 to 0.9, optimally from 0.15 to 0.85.

The P-type conductive layer 103 and the N-type conductive layer 105 may contain a P-type impurity for giving P-type conductive characteristic or an N-type impurity for giving N-type conductive characteristics during layer formation or alternatively P-type or N-type impurity may be injected into the layer already constituted of non-SiC:H by means of the ion implantation method, etc.

Examples of the P-type impurity may include the atoms belonging to the so called group III of the periodic table (the group III atoms), namely B (boron), Al (aluminum), Ga (gallium), In (indium), Tl (thallium), etc., particularly preferably B and Ga.

Examples of the N-type impurity may include the atoms belonging to the group V of the periodic table (group V atoms), namely P (phosphorus), As (arsenic), Sb (antimony), Bi (bismuth), etc., particularly preferably P and As.

The contents of these impurities are determined suitably as desired in view of the electroconductive characteristics, the localized level density at the mid-gap, etc., of the layer formed.

In the present invention, the constitution as described above can be given by employment of the optical CVD method (the method for forming deposited film according to the chemical vapor deposition method in which photoenergy is utilized for the reaction), and it is desirable to select starting materials for introduction of the above impurities which are suited for the optical CVD method.

The I-type conductive layer 104 is a layer which exhibits the so-called intrinsic semiconductor characteristic and for making the layer constituted of non-SiC:H, which exhibits slightly an N-type tendency as the general tendency when containing no impurity of the so called P-type or the N-type, I-type conductive layer, a P-type impurity is slightly incorporated therein.

The I-type conductive layer 104 can be also made a so called non-doped layer containing no impurity of the P-type or the N-type, although luminescent characteristics may be slightly lowered.

Also, in the case of light emitting device shown in FIG. 1, the luminescent layer is made to have a layer constitution of P-type, I-type and N-type from the side of the substrate 101, but such an order of lamination is not limitative in the present invention, but a layer constitution in the order of N-type, I-type and P-type from the substrate 101 side may be employed.

Figure 2:
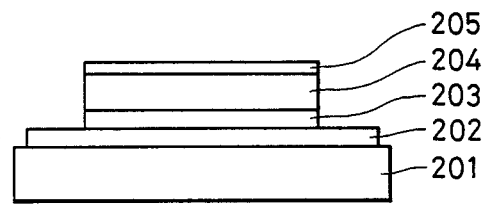

FIG. 2 shows a schematic illustration of the layer constitution of a second preferred embodiment of the light emitting device of the present invention.

The light emitting device shown in FIG. 2 has the same layer constitution as that shown in FIG. 1 except for having no I-type conductive layer, and it is a light emitting device utilizing the so called P-N junction.

That is, the light emitting device shown in FIG. 2 is constituted of a lower electrode 202, a P-type conductive layer 203, an N-type conductive layer 204 and an upper electrode 205 on a substrate 201.

Also, in the case of the light emitting device shown in FIG. 2, similarly as the light emitting device shown in FIG. 1, the order of lamination of the P-type conductive layer 203 and the N-type conductive layer 204 is not limited to that above explained, but also the opposite order or lamination may be used.

In the light emitting device of the present invention shown in FIG. 1 and FIG. 2, the luminescent layer is constituted by laminating a P-type conductive layer, I-type conductive layer, N-type conductive layer or a layer containing no impurity (non-doped layer) constituted of non-SiC:H according to a suitable combination as desired, and luminescence is effected by injecting electrons from the N-type conductive layer and holes from the P-type conductive layer into the region of the I-type conductive layer or the non-doped layer or the spacial charge layer around the PN junction to be recombined therein by applying a forward bias voltage across a pair of opposed electrodes provided with the luminescent layer sandwiched therebetween. In this case, in order to obtain a luminescent wavelength in the visible region, the optical band gap Egopt of each layer constituting the luminescent layer consisting of non-SiC:H is made 2.0 eV or more.

Each layer constituting the luminescent layer is made to have a localized level density at the center of the optical band gap (mid-gap) of $5 \times 10^{16}$ cm$^{-3}$·eV$^{-1}$ or less, preferably $1 \times 10^{16}$ cm$^{-3}$·eV$^{-1}$ or less.

Thus, by controlling the physical property values of each layer, the efficiency of recombination can be dramatically improved and hence luminescent efficiency can be improved.

Also, by controlling the distribution of the levels of recombination so that the external quantum efficiency of the luminescent layer may become $10^{-4}$% or more, a light emitting device exhibiting luminescence of high intensity can be obtained.

The light emitting device having the characteristics as described above should desirably be prepared according to the optical CVD method as described above under the conditions as shown in the following description and Examples.

Figure 3:
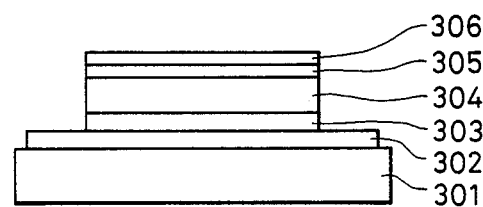

FIG. 3 is a schematic illustration showing the layer constitution of a third preferred embodiment of the light emitting device of the present invention.

The light emitting device shown in FIG. 3 is constituted of a lower electric insulating layer 303, a luminescent layer 304 and upper electric insulating layer 305 on a lower electrode 302 provided on a substrate 301 and an upper electrode 306 provided on the insulating layer 305.

When the light emitting device shown in FIG. 3 is to be used as a planar light emitting device, the electrode 302 and/or the electrode 306 are required to be transparent if the color of the luminescent color is also utilized, or desired to be transmissive to the luminescent light if the luminescent quantity is to be utilized. When the luminescent light is to be taken out from the side of the electrode 302, the substrate 301 is desired to be transparent similarly as the electrode 302 or transmissive to the luminescent light.

The luminescent layer 304 is constituted of non-SiC:H, and it is preferably prepared as a layer exhibiting the so called intrinsic (I-type) semiconductor characteristics. Since the layer constituted of non-SiC:H exhibits slightly an N-type tendency as its general tendency when containing no impurity of the so called P-type or the N-type, a P-type impurity is slightly contained for making the luminescent layer 3-4 I-type conductive layer.

It is also possible to make the luminescent layer 304 the so called non-doped layer containing no impurity of the P-type or the N-type, although luminescent characteristics may be slightly lowered.

For making the luminescent layer 304 an I-type conductive layer, a P-type impurity for giving P-type conductive characteristics may be contained during layer formation or alternatively a P-type impurity may be injected into the layer already constituted of non-SiC:H by means of the ion implantation method, etc.

As the material constituting the electric insulating layers 303 and 305, most materials can be employed, provided that they have electrically good insulating characteristics, have no bad influence in taking out externally the luminescent light in the luminescent layer 304 with good efficiency and can be formed into films with ease.

Either one of the insulating layers 303 and 305 is required to be transparent to the luminescent light in order to take out the luminescent light externally. Specific examples of the material constituting the insulating layers 303 and 305 preferably used in the present invention may include $Y_2O_3$, $SiO_2$, amorphous silicon oxide (a-$Si_xO_{1-x}$, where $0<x<1$), $HfO_2$, $Si_3N_4$, amorphous silicon nitride (a-$Si_yN_{1-y}$, where $0<y<1$), $Al_2O_3$, $PbTiO_3$, amorphous $BaTiO_3$, $Ta_2O_5$, etc.

Figure 4:
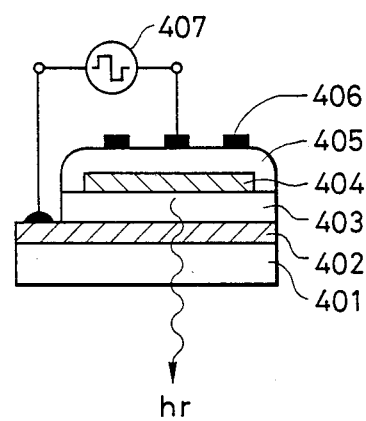

FIG. 4 shows a fourth preferred embodiment of the light emitting device of the present invention.

The light emitting device shown in FIG. 4 has the same basic structure as that shown in FIG. 3.

The light emitting device shown in FIG. 4 has a layer structure in which a transparent electrode 402, a lower insulating layer 403, a luminescent layer 404, an upper insulating layer 405 and a metal electrode 406 are successively laminated on a transparent substrate 401 such as a glass, etc. To the electrode 402 and the metal electrode 406 are connected electrically the connecting terminals of the power source 407 for applying a high frequency electrical field in shape of pulses or saw teeth, respectively. In the case of light emitting device shown in FIG. 4, when a high frequency electrical field is applied by a high frequency power source 407, luminescence occurs from the luminescent layer 404, and the luminescent light is released to the outside by transmitting through the insulating layer 403, the transparent electrode 402 and the substrate 401.

The light emitting device of the present invention shown in FIG. 3 and FIG. 4 is made to have an optical band gap Egopt of the luminescent layer of 2.0 eV or higher in order to obtain a luminescent wavelength in the visible region.

The localized level density at the center of the optical band gap (mid-gap) of the luminescent layer in the light emitting device shown in FIG. 3 and FIG. 4 should desirably be made $5 \times 10^{16}$ cm$^{-3}$·eV$^{-1}$ or less, preferably $1 \times 10^{16}$ cm$^{-3}$·eV$^{-1}$ or lower.

Thus, by controlling the physical property values of the luminescent layer, efficiency of recombination can be dramatically improved and hence luminescent efficiency can be improved.

Also, by controlling the distribution of levels of recombination so that the outer quantum efficiency of the luminescent layer may become $10^{-4}$% or more, a light emitting device exhibiting luminescence of high intensity can be obtained.

Figure 5:
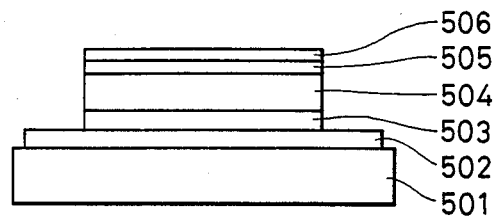

FIG. 5 is a schematic illustration of the layer constitution of a fifth preferred embodiment of the light emitting device of the present invention.

The light emitting device shown in FIG. 5 is constituted of a luminescent layer comprising a P-type conductive layer 503, a semiconductive intermediate layer 504 and an N-type conductive layer 505 and an electrode 506 provided on said luminescent layer on an electrode 502 provided on a substrate 501.

When the light emitting device shown in FIG. 5 is to be used as a planar light emitting device, the electrode 502 and/or the electrode 506 are required to be transparent if the color of luminescent light is also utilized, or desired to be transmissive to the luminescent light if the luminescent quantity is to be utilized. When the luminescent light is to be taken out from the side of the electrode 502, the substrate 501 is desired to be transparent similarly as the electrode 502 or transmissive to the luminescent light.

In the light emitting device of the present invention shown in FIG. 5, at least one layer of the P-type conductive layer 503, the semiconductive intermediate layer 504 and the N-type conductive layer 505 constituting the luminescent layer as described above has a multi-layer structure in which a first layer region (I) constituted of non-SiC:H and a second layer region (II) different in optical band gap Egopt from said first layer region (I) are laminated as one unit of these periodically. And, in order to accomplish more effectively the effect of the present invention, the first layer region (I) and the second layer region (II) to be laminated in a periodic structure are laminated alternately with the respective layer thicknesses sd as to give the quantum mechanic size effect, thereby constructing a so-called ultra-lattice structure.

The second layer region (II) is formed by selecting the material so that its optical band gap Egopt (II) may be preferably greater than the optical band gap Egopt (I) of the first layer region (I), namely the second layer region (II) may play a role of the potential barrier layer.

In the light emitting device of the present invention shown in FIG. 5, the semiconductive intermediate layer 504 is formed as an I-type conductive layer exhibiting genuine semiconductor characteristics or as a slightly N-type or P-type conductive layer. And, the layer constituted of non-SiC:H exhibits slightly N-type tendency as its general tendency when containing no impurity of the so called P-type and the N-type, and therefore a P-type impurity is contained in order to make it an I-type conductive layer.

Figure 6:
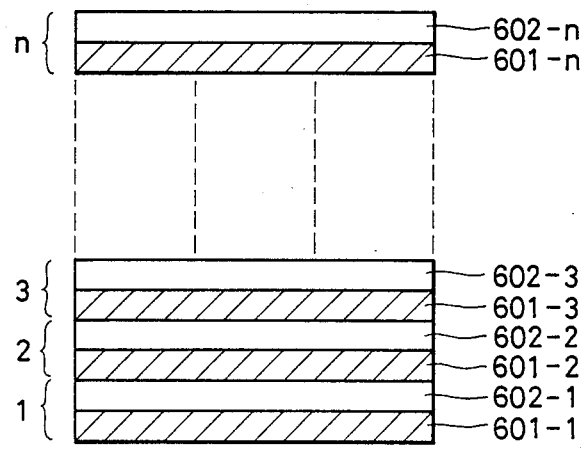

FIG. 6 shows an embodiment of the layer constitution, in which the above first layer region (I) 601 and the above second layer region (II) 602 are laminated with the respective desired layer thicknesses alternately in periods of n.

The second region (II) 602 has an optical band gap Egopt greater than that of the first layer region (I) 601, a hetero-junction being formed at the bonded portion between the first layer region (I) 601 and second layer region (II) 602. As the material for constituting the second layer region (II) 602, there may be employed non-single crystalline semiconductor materials or non-single crystalline electrically insulating materials having greater optical band gap Egopt than non-SiC:H. These materials constituting the second layer region (II) 602 are different in chemical composition elements or chemical composition ratio from the material constituting the first layer region (I) 601, but improvement of the luminescent characteristics can be done more effectively if the constituent elements constituting their matrices are common.

In the present invention, the respective layer thicknesses of the first layer region (I) 601 and the second layer region (II) 602 for introducing a ultra-lattice structure may be determined suitably as desired depending on the materials constituting the respective layer regions and the device characteristics demanded, but they should desirably be determined so that a marked quantum size effect may be obtained.

The layer thicknesses of the first and the second layer regions may be preferably 5 Å to 100 Å, more preferably 8 Å to 80 Å, optimally 10 Å to 70 Å. Particularly, the layer thickness should desirably be made about the De Broglie wavelength of the carrier or about the mean free path of the carrier. When, introducing the above ultra-lattice structure into the semiconductive intermediate layer 504, specifically for example, the first layer region (I) 601 is constituted of the so-called non-doped non-SiC:H layer containing none of the impurities of the P-type and N-type or an I-type non-SiC:H layer which has been made an intrinsic semiconductor by incorporating slightly a P-type impurity, and the second layer region (II) 602 is constituted of a semiconductive or electrically insulating non-single crystalline material containing silicon atoms and nitrogen atoms, optionally containing hydrogen atoms (H) or fluorine atoms (F) [hereinafter abbreviated as "non-SiN(H,F)"], or a semiconductive or electrically insulating non-single crystalline material containing silicon atoms (Si) and oxygen atoms (O), optionally containing hydrogen atoms (H) or fluorine atoms (F) [hereinafter abbreviated as "non-SiO(H,F)"], respectively.

The first layer region (I) 601 and the second layer region (II) 602 comprising these materials are laminated alternately in ten-odd periods to tens of periods with the respective layer thicknesses.

When introducing the above ultra-lattice structure into the P-type conductive layer 503 or the N-type conductive layer 505, the layer region (I) 601 is constituted of non-SiC:H containing a predetermined amount of a P-type or N-type impurity, but the second layer region (II) 602 is the same as in the case of the above semiconductive intermediate layer 504.

The ultra-lattice structure which can be introduced into these respective layers may be introduced into not only one layer but also two or more layers, namely, for example, the P-type conductive layer and the semiconductive intermediate layer 504 or into the three layers of the P-type conductive layer 503, the semiconductive intermediate layer 504 and the N-type conductive layer 505, respectively.

In the present invention, at least a part of the layer constituting the luminescent layer is constituted of non-SiC:H, regardless of the presence of an impurity.

In the case of the light emitting device shown in FIG. 5, the luminescent layer is made to have a layer constitution of a P-type conductive layer, an intermediate layer and a N-type conductive layer from the substrate 501 side, but no such lamination order is limitative of the present invention, but it is also possible to employ a layer constitution in the order of an N-type conductive layer, an intermediate layer and a P-type conductive layer from the substrate 501 side.

Figure 7:
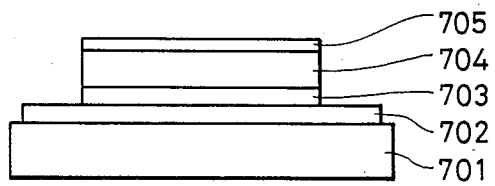

FIG. 7 shows schematically the layer constitution of a sixth embodiment of the light emitting device of the present invention.

The light emitting device shown in FIG. 7 has the same layer constitution as that shown in FIG. 5 except for having no semiconductive intermediate layer 504, and it is a light emitting device utilizing the so called P-N junction.

That is, the light emitting device shown in FIG. 7 consists of a lower electrode 702, a P-type conductive layer 703, a N-type conductive layer 704 and an upper electrode 705 on a substrate 701.

Also, in the case of the light emitting device shown in FIG. 7, similarly as the light emitting device shown in FIG. 5, the order of the P-type conductive layer 703 and the N-type conductive layer 704 laminated is not limited to that as described above, but the opposite lamination order may be employed.

In the light emitting device of the present invention shown in FIG. 5 and FIG. 7, the luminescent layer is constituted by laminating a P-type conductive layer, a semiconductive intermediate layer, an N-type conductive layer or a layer containing no impurity (non-doped layer) constituted of non-SiC:H according to a suitable combination as desired, and luminescence is effected by injecting electrons from the N-type conductive layer and holes from the P-type conductive layer into the semiconductive intermediate layer or the spacial charge layer region around the PN junction to be recombined therein by applying a forward bias voltage across a pair of opposed electrodes provided with the luminescent layer sandwiched therebetween. In this case, in the present invention, in order to obtain a luminescent wavelength in the visible region, the optical band gap Egopt of each layer constituting the luminescent layer comprising non-SiC:H should desirably be made 2.0 eV or higher. Each layer constituting the luminescent layer of the light emitting device shown in FIGS. 5 and 7 should preferably be made to have a localized level density at the center of the optical band gap (mid-gap) of $5 \times 10^{16}$ cm$^{-3}$·eV$^{-1}$ or less. preferably $1 \times 10^{16}$ cm$^{-3}$·eV$^{-1}$ or less. Thus, by controlling the physical property values of the respective layers, efficiency of recombination can be improved dramatically and hence luminescent efficiency can be further improved.

Also, by controlling the distribution levels of recombination so that the external quantum efficiency of the luminescent layer may become $10^{-4}$% or higher, an light emitting device exhibiting luminescence of high intensity can be obtained.

Figure 8:
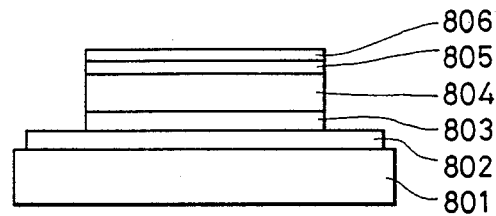
Figure 9:
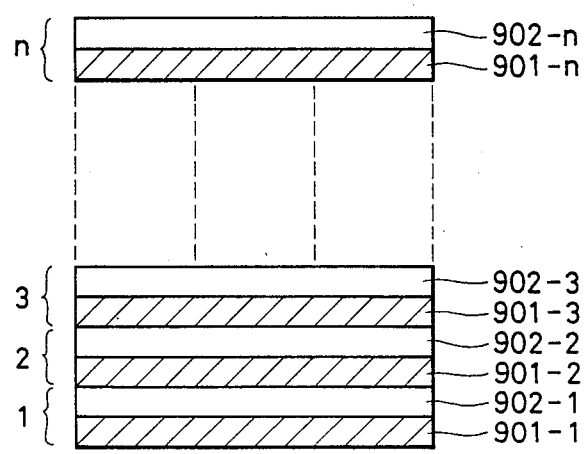

FIG. 8 is a schematic illustration of the layer constitution of a seventh preferred embodiment of the light emitting device of the present invention.

The light emitting device shown in FIG. 8 is constituted of a lower electric insulating layer 803, a luminescent layer 804 and an upper electric insulating layer 805 on a lower electrode 802 provided on a substrate 801 and an upper electrode 806 provided on said insulating layer 805.

When the light emitting device shown in FIG. 8 is to be used as a planar light emitting device, the electrode 802 and/or the electrode 806 are required to be transparent if the color of luminescent light is also utilized, or desired to be transmissive to the luminescent light if the luminescent quantity is utilized. When the luminescent light is taken out from the electrode 802 side, the substrate 801 is desired to be transparent similarly as the electrode 802 or transmissive to the luminescent light.

The light emitting device of the present invention shown in FIG. 8 has a multi-layer structure in which a first layer region (I) consisting of non-SiC:H and a second layer region (II) different in optical band gap Egopt from said layer region (I) are laminated periodically with these layer regions as one unit. And, in order to accomplish more effectively the effect of the present invention, the first layer region (I) and the second layer region (II) laminated in a periodic structure should be laminated alternately with the respective layer thicknesses selected so as to give the quantum mechanic size effect similarly as in the case of the light emitting device shown in FIG. 7, thereby constructing the so-called ultra-lattice structure.

Also, as to the optical band gap Egopt (II) of the second layer region (II), similarly as in the case of the light emitting device shown in FIG. 7, the layer is formed by selecting the material so that it may be preferably greater than the optical band gap Egopt (I) of the first layer region (I), namely so that the second layer region (II) may play a role of the potential barrier layer.

Otherwise, the description about the light emitting device shown in FIG. 5 and FIG. 7 is may be applicable as such for description about the light emitting device shown in FIG. 8, although there may be more or less changes.

Figure 10:
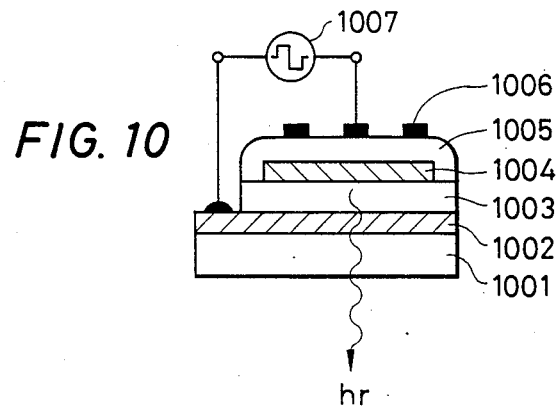

FIG. 10 shows an eighth preferred embodiment of the light emitting device of the present invention.

The light emitting device shown in FIG. 10 has a structure which is basically the same as that shown in FIG. 8.

The light emitting device shown in FIG. 10 has a layer structure comprising a transparent electrode 1002, a lower insulating layer 1003, a luminescent layer 1004, an upper insulating layer 1005 and a metal electrode 1006 laminated successively on a transparent substrate 1001 such as of glass, etc., and connecting terminals of power source 1007 for application of a high frequency electrical field in shape of pulses or saw teeth are connected electrically to the electrode 1002 and the metal electrode 1006, respectively.

In the case of the light emitting device shown in FIG. 10, when a high frequency electrical field is applied by the high frequency power source 1007, luminescence occurs from the luminescent layer 1004 and the luminescent light is released to the outside by transmitting through the insulating layer 1003, the transparent electrode 1002 and the substrate 1001.

For other descriptions about the light emitting device shown in FIG. 10, the description about the light emitting device shown in FIG. 8 can be applied as such.

Figure 11:
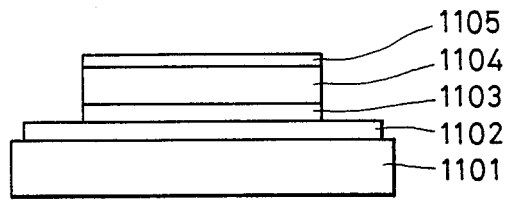

FIG. 11 is a schematic illustration showing the layer constitution of a ninth preferred embodiment of the light emitting device of the present invention.

The light emitting device shown in FIG. 11 is constituted of a luminescent layer 1104 comprising a P-type conductive layer (P layer), a first semiconductive intermediate layer (I) and an N-type conductive layer (N layer) and a second semiconductive intermediate layer (II) and an electrode 1105 provided on said luminescent layer 1104 on an electrode 1103 provided on a substrate 1101.

1102 is a subbing layer, which is provided for the purpose of improving adhesion between the substrate 1101 and the electrode 1103, and it is not necessarily required.

When the light emitting device shown in FIG. 11 is used as a planar light emitting device, the electrode 1103 and/or the electrode 1105 are required to be transparent if the color of luminescent light is also utilized, or desired to be transparent to the luminescent light if the luminescent quantity is utilized. When the luminescent light is taken out from the electrode 1103 side, the substrate 1101 is desired to be transparent similarly as the electrode 1103 or transmissive to the luminescent light.

In the light emitting device of the present invention shown in FIG. 11, the P-type conductive layer (P layer), the first semiconductive intermediate layer (I), the N-type conductive layer (N layer) and the second semiconductive intermediate layer (II) constituting the luminescent layer 1104 as described above are constituted of non-SiC:H.

The luminescent layer 1104 has a layer structure comprising the above P layer, the intermediate layer (I), the N layer and the intermediate (II) laminated in this order, and said layer structure should desirably be repeated periodically for the purpose of improving luminescent characteristics. In that case, the repeated period number is determined suitably depending on the layer thicknesses of the respective layers in one period, but it is desirably 10 and some periods to some 10 periods when the respective layers are made thin to the extent so as to give the quantum mechanic size effect. In that case, the both end portions of the luminescent layer 1104 are not necessarily required to have the layer constitution order of the periodic layer structure.

Thus, for example, a structure of [P layer·intermediate layer (I)·N layer·intermediate layer (II)] n·N layer·semi conductive intermediate layer (III)·P layer may be employed. In this case, the intermediate layer (I), the intermediate layer (II) and the intermediate layer (III) may have electroconductive characteristics different from each other or alternatively they may have the same electroconductive characteristics.

In the present invention, the layer thicknesses of the P layer, the intermediate layer (I), the N layer and the intermediate layer (II) may be selected suitably as desired depending on whether a ultra-lattice structure is introduced or a mere repeated periodical layer structure is constructed and further with consideration about the luminescent characteristics demanded for the device.

In the light emitting device shown in FIG. 11, the P layer and N layer should have layer thicknesses preferably of 5 Å to 10,000 Å, more preferably 8 Å to 8000 Å, optimally 10 Å to 7000 Å.

The intermediate layer (I) and the intermediate layer (II) should have layer thickness preferably of 5 Å to 15,000 Å, more preferably 8 Å to 10,000 Å, optimally 10 Å to 8000 Å.

In the present invention, for introducing a ultra-lattice structure into the light emitting device shown in FIG. 11, the respective layer thickness of the P layer, the N layer, the intermediate layer (I) and the intermediate layer (II) may be determined depending on the materials constituting the respective layers and the device characteristics demanded, but it is desirable that they should be determined so that the quantum size effect may be conspicuous.

That is, the layer thickness of each layer should preferably be 5 Å to 100 Å, more preferably 8 Å to 80 Å optimally 10 Å to 70 Å. Particularly, it should desirably be made about the De Broglie wavelength of the carrier or about the mean free path of the carrier.

The light emitting device of the present invention shown in FIG. 11 has longer life of electrons and holes as compared with the case of a conventional bulk, because the carriers (electrons, holes) injected into the luminescent layer from a pair of electrodes provided with a luminescent layer sandwiched therebetween are accumulated respectively in the vicinity of the N layer in the case of electrons and in the vicinity of the P layer in the case of holes by the internal electical field of the semiconductive intermediate layer. Accordingly, luminescent efficiency is extremely high.

Also, because of having a multi-layer structure by periodical lamination, there exists a plural number of effective recombination regions contributing to luminescence of electrons and holes, whereby luminescent efficiency can be further improved.

In the light emitting device of the present invention shown in FIG. 11, the bias voltage applied is selected so as to apply forward bias at the bonding portions between the respective layer, and greatness of the bias is controlled so that the probability of recombination of electrons and holes once injected into the luminescent layer may be greater. As the bias to be used in this case, AC or pulse bias may be preferably employed at the same time as DC bias.

Other descriptions about the light emitting device shown in FIG. 11 can be omitted, because most of the description about other light emitting devices given hereinabove can be applied therefor.

Figure 12:
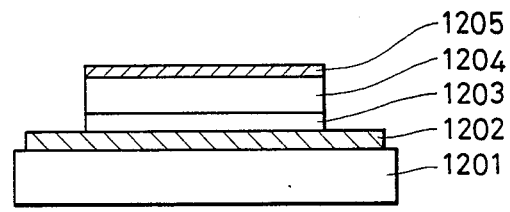

FIG. 12 is a schematic illustration showing the layer constitution of a tenth preferred embodiment of the light emitting device of the present invention.

The light emitting device shown in FIG. 12 is constituted of an electric insulating layer 1203, a luminescent layer 1204 and an upper electrode 1205 provided on said luminescent layer 1204, on a lower electrode 1202 provided on a substrate 1201.

When the light emitting device shown in FIG. 12 is to be used as a planar light emitting device, the electrode 1202 and/or the electrode 1205 are required to be transparent when the color of the luminescent light is also utilized, and desired to be transmissive to the luminescent light if the luminescent quantity is utilized. When the luminescent light is taken out from the electrode 1202 side, the substrate 1201 should be desirably transparent similarly as the electrode 1202 or transmissive to the luminescent light.

The luminescent layer of the present invention shown in FIG. 12 is constituted of non-SiC:H.

For other description about the light emitting device shown in FIG. 12, the descriptions about other light emitting devices as already given can be applied as such.

Figure 13:
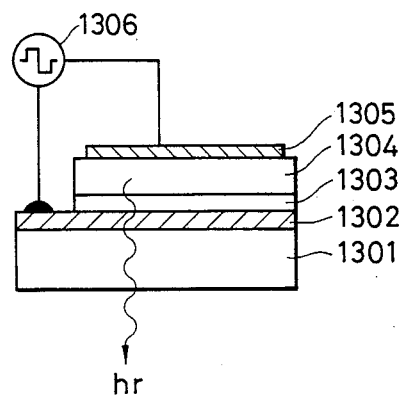

FIG. 13 shows an eleventh preferred embodiment of the light emitting device of the present invention.

The light emitting device shown in FIG. 13 has a structure which is basically the same as that shown in FIG. 12.

The light emitting device shown in FIG. 13 has a layer constitution comprising a transparent electrode 1302, an insulating layer 1303, a luminescent layer 1304 and a metal electrode 1305 successively laminated on a transparent substrate 1301 such as of a glass, etc., and to the electrode 1302 and the metal electrode 1305 are respectively connected electrically by connecting terminals of the power source 1306 for application of a high frequency electrical field in shape of pulses or saw teeth.

In the case of the light emitting device shown in FIG. 13, when a high frequency electrical field is applied from a high frequency power source 1306, luminescence occurs from the luminescent layer 1304 and the luminescent light is released to the outside by transmitting thorough the insulating layer 1303, the transparent electrode 1302 and the substrate 1301.

The process of light emission in this case may be considered as follows. That is, the process in which the electron-hole pair trapped at the interface level formed at the interface between the insulation layer 1303 and the luminescent layer 1304 is accelerated by the electrical field to be collided and recombined with light emission and the process in which electrons of high energy are injected through a Schottky barrier formed at the interface between the metal electrode 1305 and the luminescent layer 1304 are repeated every half cycle of the excited high frequency electrical field. Light emitting light emission occurs according to these two processes.

Other descriptions about the light emitting device shown in FIG. 13 are omitted here, because the description about other light emitting devices already given can be applied almost as such.

Figure 14:
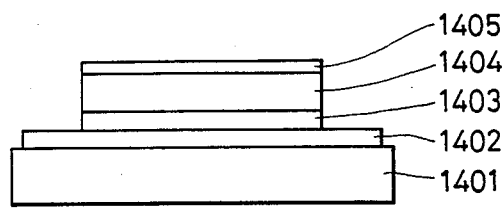

FIG. 14 is a schematic illustration showing the layer constitution of a twelfth preferred embodiment of the light emitting device of the present invention.

The light emitting device shown in FIG. 14 is constituted of an electric insulating layer 1403, a luminescent layer 1404 and an upper electrode 1405 provided on said luminescent layer 1404 on a lower electrode 1402 provided on a substrate 1401.

When the light emitting device shown in FIG. 14 is to be used as a planar light emitting device, the electrode 1402 and/or the electrode 1405 are required to be transparent if the color of the luminescent light is utilized, or desired to be transmissive to the luminescent light if the luminescent quantity is utilized. When the luminescent light is taken out from the electrode 1402 side, the substrate 1401 is desired to be transparent similarly as the electrode 1402 or transmissive to the luminescent light.

The light emitting device of the present invention shown in FIG. 14 has a multi-layer structure in which a first layer region (I) constituted of non-SiC:H and a second layer region (II) different in optical band gap Egopt from said layer region (I) are laminated periodically with these regions as one unit. And, in order to accomplish more effectively the effect of the present invention, the first layer region (I) and the second layer region (II) to be laminated in a periodic structure are laminated alternately with the respective layer thicknesses which are selected so that the quantum mechanic size effect may be obtained, thus constructing a so called ultra-lattice structure.

These layers are formed by selecting the materials so that the optical band gap Egopt (II) of the second layer region (II) may be preferably greater than the optical band gap Egopt (I) of the first layer region, namely so that the second layer region (II) may play a role of a potential barrier layer.

Figure 15:
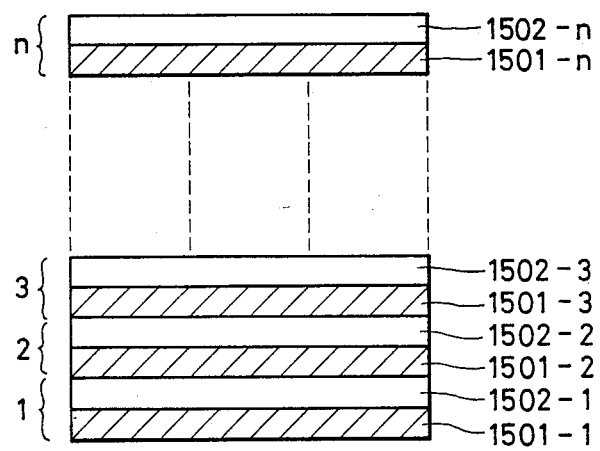

FIG. 15 shows an example in which the above first layer region (I) 1501 and the above second layer region (II) 1502 are. laminated alternately with respective desired layer thicknesses in periods of n.

The second layer region (II) 1502 has an optical band gap Egopt greater than that of the first layer region (I) 1501, and a hetero-junction is formed at the bonded portion between the first layer region (I) 1501 and the second layer region (II) 1502. As the material for constituting the second layer region (II) 1502, there may be employed a non-single crystalline semiconductor material or a non-single crystalline electric insulating material having greater optical band gap Egopt than non-SiC:H similarly as in the case of the light emitting device as shown in FIG. 5 and FIG. 8. Theses materials constituting the second layer region (II) 1502 are different in chemical composition elements or a chemical composition ratio from the material constituting the first layer region (I) 1501 similarly as in the case of the light emitting device shown in FIG. 5 and FIG. 8, but the luminescent characteristics can be improved more effectively if the constituent elements constituting their matrices are common.

Other descriptions necessary for the light emitting device shown in FIG. 14 are omitted, since the descriptions about the light emitting device shown in FIG. 5 and FIG. 8 can be applied similarly.

The method for preparing the light emitting device of the present invention which has been described above by referring to various embodiments is not limited to the optical CVD method so long as the object of the present invention can be accomplished, and it can also be prepared according to the HOMO CVD method, the plasma CVD method, etc., by setting appropriately the desired conditions.

The materials constituting the substrate and the electrode constituting the light emitting device of the present invention may include most of the materials generally used in the field of light emitting device.

The substrate may be either electroconductive or insulating, but materials having relatively excellent heat resistance are desirable.

In the case of an electroconductive substrate, the electrodes to be provided between the substrate and the luminescent layer are not necessarily required to be provided. Examples of electroconductive substrate may include NiCr, stainless steel, Al, Cr, Mo, Au, Nb, Ta, V, Ti, etc.

Examples of electrically insulating substrates may include films or sheets of synthetic resins such as polyester, polyethylene, polycarbonate, polyamide, etc., or glass, ceramics, etc.

When an electrically insulating material is employed as the substrate, its surface is subjected to electroconductive treatment as the electrode between the substrate and the luminescent layer.

For example, in the case of a glass, electroconductivity is imparted by providing a thin film comprising NiCr, Al, Cr, Mo, Au, Ir, Nb, Ta, V, Ti, Pt, Pd, $In_2O_3$, $SnO_2$, ITO ($In_2O_3+SnO$), etc., on its surface. Alternatively, in the case of a synthetic resin such as a polyester film, etc., a thin film of a metal such as NiCr, Al, Ag, Pb, Zn, Ni, Au, Cr, Mo, Ir, Nb, Ta, V, Ti, Pt, etc., is provided on its surface according to vacuum vapor deposition, electron beam vapor deposition, sputtering, etc., or its surface is laminated with an above metal to impart electroconductivity to its surface.

As the starting gases for introduction of silicon atoms and hydrogen atoms for formation of the luminescent layer to be used in the case of the optical CVD method, there may be employed cyclic hydrogenated silicon compounds represented by the formula $Si_nH_{2n}$ ($n=3, 4, 5, \ldots$) and straight or branched chain hydrogenated silicon compounds represented by $Si_nH_{2n+2}$ ($n=2, \ldots$). The starting gases for introduction of carbon atoms may include gaseous or readily gasifiable hydrocarbon compounds such as $CH_4$, $C_2H_6$, $C_3H_8$, $C_4H_{10}$, $C_2H_4$, $C_3H_6$, $C_4H_8$, $C_2H_2$, $CH_3C_2H$, $C_4H_6$, etc.

Otherwise, $(CH_3)_2SiH_2$, $(CH_3)_3SiH$, $(CH_3)_4Si$, etc., may be also employed.

The respective silicon compounds and carbon compounds as mentioned above may be also used in combination of two or more kinds and, in this case, characteristics to the extent of an average of the film characteristics expected for the respective compounds or characteristics synergetically improved can be obtained.

Also, the above starting gases may be used as a mixture with hydrogen gas or fluorine gas or with an inert gas such as He, Ne, Ar, etc.

A specific example of the method for preparing the device of the present invention is described below by referring to the optical CVD method. The preparation means and preparation conditions as described below show a preferable example, which is not limitative of the present invention as a matter of course.

Figure 17:
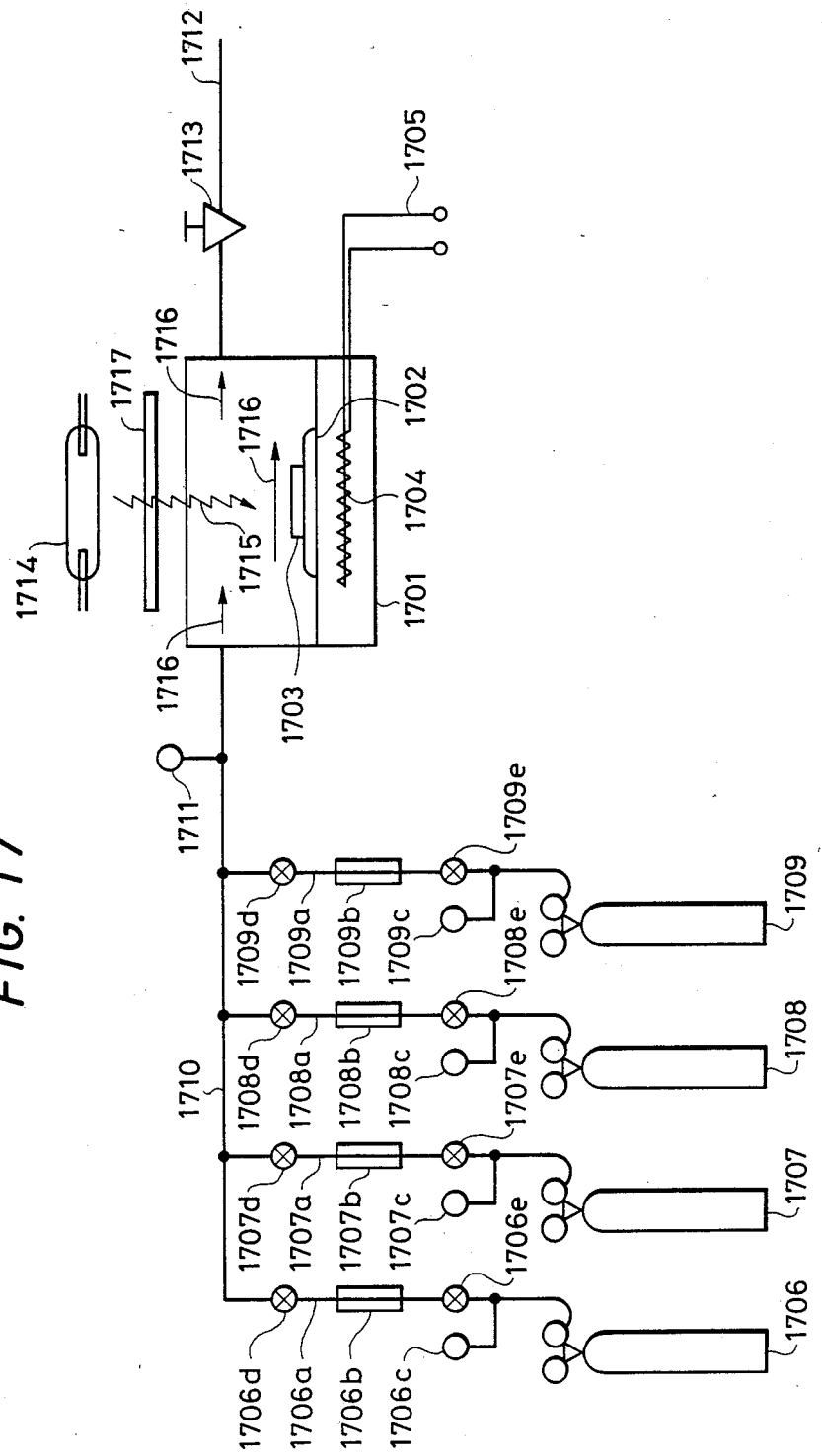
FIG. 17 is a schematic illustration showing an embodiment of the device for preparing the light emitting device of the present invention.

First, by use of a glass substrate (C#7509) as the substrate, an ITO layer with a thickness of 600 Å is formed as the electroconductive layer thereon according to sputtering. The film is made to have a resistance value of about 50 Ω/□. Next, the above electroconductive substrate 1703 is set on a substrate holder 1702 of an optical CVD device as shown in FIG. 17, and at first vacuum evacuation is effected by means a pump 1712. When the vacuum degree becomes about $1\times10^{-6}$ or less, the temperature of the substrate holder 1702 is elevated and the substrate temperature is set as desired. In the present invention, the substrate temperature may be preferably −20° C. to 200° C., more preferably 0° C. to 150° C. Next, carbon type gases such as $CH_4$, $C_2H_6$, $C_3H_8$, $C_4H_{10}$, $C_2H_4$, $C_3H_6$, $C_4H_8$, $C_2H_2$, $CH_3C_2H$, $(CH_3)_2SiH_2$, $(CH_3)_3SiH$, etc., silane type gases such as $SiH_4$, $Si_2H_6$, $Si_3H_8$, $Si_4H_{10}$, etc., nitrogen type gases such as $N_2$, $NH_3$, $H_2NNH_2$, $HN_3$, $NH_4$, $N_3$, etc., and optionally gases for introduction of impurities ($B_2H_6$, $BF_3$, $PH_3$, $P_2H_5$, $PF_3$, etc.) are permitted to flow into the reaction tank by use of the bombs 1706, 1707, 1708 and 1709 and flowmeters 1706b-1709b. During this operation, the gases of $H_2$, Ar, He, etc., may be also permitted to flow into the reaction tank at the same time.

As the next step, a light of 185 nm is irradiated by use of a low pressure mercury lamp from above the reaction tank onto the substrate at an intensity of about 5 to 50 mW/cm² to deposit layers.

For formation of P-type or N-type conductive layers, gases such as $B_2H_6$, $BF_3$, etc., mixed with a gas such as $H_2$, Ar, etc., at the concentrations controlled are permitted to flow into the reaction tank at the same time with the above fluorine type gases in the case of P-type. On the other hand, in the case of N-type, gases such as $PH_3$, $PF_3$, $AsH_3$, etc., are permitted to flow into the reaction tank as a mixture with a gas such as $H_2$, Ar. After inflow of the gases, under a pressure controlled, the gases are decomposed by irradiation of light to deposit films. The film thickness may be controlled by varying the light intensity and the light irradiation time.

The optical band gap of each layer constituting the luminescent layer of the light emitting device as described above can be determined by measuring the absorption coefficient $\alpha$ and calculating from the relationship between $\sqrt{\alpha h\nu}$ and $h\nu$, and the localized level density according to the FE method, and the quantum efficiency from the luminescent characteristics of diode (having temperature depedency).

EXAMPLE 1

A light emitting device having the constitution as shown in FIG. 1 was prepared by use of the device shown in FIG. 17 as described below. By use of an ITO substrate, a film was prepared at a substrate temperature of 45° C. The P-type conductive layer was prepared by permitting the gases to flow into the reaction tank at a flow rate of $B_2H_6/(C_3H_8+Si_2H_6)=10^{-2}$, at a flow rate of 80 SCCM of $C_3H_8$, at a flow rate of 20 SCCM of $Si_2H_6$ and at a flow rate of 20 SCCM of $H_2$; the N-type conductive layer at a flow rate ratio of $PH_3/(C_3H_8+Si_2H_6)=10^{-2}$, at a flow rate of 80 SCCM of $C_3H_8$, at a flow rate of 20 SCCM $Si_2H_6$ and at a flow rate of 20 SCCM of $H_2$; and the non-dope layer at a flow rate of 20 SCCM of $Si_2H_6$ and 80 SCCM of $C_3H_8$. Each layer was prepared by the reaction under the conditions of a pressure of 0.1 Torr and a light intensity of 40 mW/cm². The P-type conductive layer had a layer thickness of 400 Å, the non-doped layer a layer thickness of 2000 Å and the n-type conductive layer a layer thickness of 600 Å.

On the upper surface of the luminescent layer, Al was vapor deposited to a thickness of 1000 Å to provide an upper electrode.

The light emitting device obtained exhibited white luminescence, and its optical band gap, localized level density, and luminescent intensity are shown in Table 1.

EXAMPLE 2

By means of the device shown in FIG. 17, the respective layers were deposited under the same conditions as in Example 1 except for setting the substrate temperature at 20° C. The P-type conductive layer had a layer thickness of 800 Å, the non-doped layer a layer thickness of 3500 Å and the N-type conductive layer a layer thickness of 700 Å. The light emitting device obtained exhibited white luminescence and its characteristics are shown in Table 1.

EXAMPLE 3

By means of the same device as in the case of Example 2, under the same conditions for preparation of the corresponding layers, a white luminescent light emitting device having a structure as shown in FIG. 2 was prepared with a layer thickness of the P-type conductive layer of 1500 Å and a layer thickness of the N-type conductive layer of 1500 Å. The characteristics of the device measured are shown in Table 1.

From Examples 1–3 as described above, the device of the present invention having the structure as shown in FIG. 1 and FIG. 2 was found to give white luminescence with higher intensity, as compared with the light emitting device by use of non-Si:H of the prior art which was smaller in luminescent quantity and lower in intensity in the visible region.

When the life was measured for the light emitting devices in Examples 1–3, a life higher by one cipher as compared with that of the light emitting device of the prior art was exhibited. Also, with respect to reproducibility, it was found to be good and the luminescent characteristics were constantly stable in measurement of life.

Also, when the environmental test was conducted by continuous use under the environment of 80% RH and 40° C., the initial device characteristics were found to be maintained even after 72 hours use. Thus, the light emitting device of the present invention was found to have excellent environmental characteristics.

TABLE 1

| Example No. | Optical band gap (eV) | Localized level density ($cm^{-3} \cdot eV^{-1}$) | Luminescent intensity (ft-L) |
|---|---|---|---|
| 1 | 2.4 | $8 \times 10^{15}$ | 8 |
| 2 | 2.5 | $8 \times 10^{15}$ | 5 |
| 3 | 2.5 | $1 \times 10^{16}$ | 6.5 |

EXAMPLE 4

By means of the optical CVD device as shown in FIG. 17, light emitting device having a structure shown in FIG. 4 was prepared and characteristic test was conducted by applying a high electrical field of high frequency in shape of pulses from the power source 407.

By use of $Y_2O_3$ thin film with a thickness of 3000 Å as the insulating layers 403 and 405 and by use of gases of ($C_2H_4 + Si_2H_6$) as the starting gas for the luminescent layer, films were formed by use of a low pressure mercury lamp at a substrate temperature of 50° C. During this operation, the flow rates of $C_2H_4$ and $Si_2H_6$ were 80 SCCM and 40 SCCM, respectively. As the electrode 402, an ITO transparent electrode was employed and an Al electrode as the electrode 406. When a high electrical field of high frequency in shape of pulses of 100 V and 1 KHz was applied on the thus prepared light emitting device, luminescence having a luminescent peak in the visible light region of 12 ft-L was obtained. This is a value greater by about one cipher as compared with the luminescence of light emitting device by use of a non-single crystalline silicon (non-Si:H) which has hitherto been realized, thus exhibiting improvement of luminescent efficiency. Further, stability and durability of luminescent characteristics were tested by applying the above high frequency electrical field continuously over a long time. As the result stability was found to be more excellent by about 3-fold and durability by 1.5 cipher as compared with the prior art example.

Also, device of Sample No. 2,3 were prepared in the same manner as described above except for varying the substrate temperature as shown in Table 2, and their respective characteristics were measured to obtain the results shown in Table 2.

For the light emitting device of each sample, life was measured to give a value higher by one cipher than that of the prior art light emitting device. Also, reproducibility was found to be food and luminescent characteristics were constantly stable in measurement of life.

Further, when the environmental test was conducted by continuous use under the environment of 80% RH and 40° C., initial characteristics were found to be maintained even after elapse of 72 hours. Thus, the present light emitting device was found to have excellent environmental characteristics.

TABLE 2

| Sample No. | Substrate temperature (°C.) | Localized level density ($cm^{-3} \cdot ev^{-1}$) | Luminescent intensity (ft-L) |
|---|---|---|---|
| 1 | 50 | $4 \times 10^{15}$ | 20 |
| 2 | 140 | $9 \times 10^{15}$ | 10 |
| 3 | 300 | $3 \times 10^{16}$ | 5 |

EXAMPLE 5

By use of an ITO substrate as the substrate, an light emitting device shown in FIG. 5 and FIG. 6 was prepared by means of the device shown in FIG. 17 at a substrate temperature of 45° C. as described below. The P-type conductive layer was formed by permitting gases to flow into the deposition chamber at a flow rate ratio of $B_2H_6/(C_2H_4 + Si_2H_6) = 10^{-2}$, a flow rate ratio of $C_2H_4/Si_2H_6 = \frac{1}{2}$ and at a total flow rate of 120 SCCM (diluted with hydrogen); the N-type conductive layer at a flow rate ratio of $PH_3/(C_2H_4 + Si_2H_6) = 10^{-2}$ and at a total flow rate of 1200 SCCM (diluted with nitrogen); the semiconductor intermediate layer at a flow rate ratio of $C_2H_4/Si_2H_6 = 1/5$ a total flow rate of 80 SCCM for the first layer region (I) 601 and at a flow rate ratio of $NH_3/Si_2H_6 = 10^2$ and a total flow rate of 80 SCCM (diluted with nitrogen) for the second layer region (II) 602 and the N-type conductive layer at a flow rate ratio of $PH_3/C_2H_4 + Si_2H_6) = 10^{-2}$ and a flow rate ratio of $C_2H_6/Si_2H_6 = 2$ and at a total flow rate of 120 SCCM (diluted with hydrogen). Each layer was formed by the reaction under the conditions of a pressure of 0.1 Torr and a light intensity of 40 mW/cm². The P-type conductive layer was found to have a layer thickness of 400 Å, the semi-conductive intermediate layer a layer thickness of 210 Å and the N-type conductive layer a layer thickness of 600 Å.

The semiconductor intermediate layer was formed by laminating the first layer region (I) with the layer thickness of 15 Å and the second layer region (II) with a layer thickness of 15 Å alternately in periods of 7.

On the upper surface of the luminescent layer thus formed, Al was vapor deposited to a thickness of 1000 Å to provide an upper electrode. The light emitting device obtained exhibited white luminescence, and its luminescent intensity are shown in Table 3.

EXAMPLE 6

The respective layers were deposited under the same conditions as in Example 5 except for varying only the layer thickness of the semiconductive intermediate layer.

The P-type conductive layer was found to have a layer thickness of 400 Å, the semiconductive intermediate layer a layer thickness of 315 Å and the N-type conductive layer a layer thickness of 600 Å. The light emitting device obtained exhibited white luminescence and its characteristics are shown in Table 3.

EXAMPLE 7

A light emitting device of white luminescence having a structure as shown in FIG. 6 was prepared with the layer thickness of the P-type conductive layer of 400 Å and a layer thickness of the N-type conductive layer of 4000 Å by means of the same device as used in Example 6 under the same conditions for preparation of the corresponding layer. The N-type conductive layer was laminated in 100 periods of the first and the second layer regions, the first layer region (I) being formed to a 20 Å thickness at a flow rate ratio of $PH_3/(C_2H_4+Si_2H_6) = 10^{-2}$, a flow rate ratio of $C_2H_4/Si_2H_6 = 2$, and a total flow rate of 100 SCCM (diluted with nitrogen), and the second layer region (II) being formed to a 20 Å thickness at a flow rate ratio of $NH_3/Si_2H_6 = 10^2$ and a total flow rate of 80 SCCM (diluted with nitrogen). The characteristics of the device measured are shown in Table 3.

EXAMPLE 8

By means of the same preparation device and under the conditions as in Example 6, a light emitting device having a P-type conductive layer with a layer thickness of 400 Å, a semiconductive intermediate layer having 10 periods of the first layer and a second layer regions laminated with a first layer region (I) having a layer thickness of 50 Å and a second layer region (II) a layer thickness of 50 Å and a N-type conductive layer with a layer thickness of 600 Å was prepared. The light emitting device obtained exhibited white luminescence and its characteristics are shown in Table 3.

EXAMPLE 9

By means of the same preparation device and under the same conditions as in Example 8, both of the P-type conductive layer and the N-type conductive layer were made to have a layered structure including the second layer region (II), and the first and second layer regions were made to have thickness each of 20 Å and the number of periods of lamination was made 10. The light emitting device obtained exhibited white luminescence, and a relationship between the layer thickness and a luminescent intensity is shown in Table 3.

TABLE 3

| Example No. | Layer thickness of the first layer region (Å) | Layer thickness of the second layer region (Å) | Luminescent intensity (ft · L) |
|---|---|---|---|
| 5 | 15 | 15 | 30 |
| 6 | 15 | 30 | 15 |
| 7 | 20 | 20 | 20 |
| 8 | 50 | 50 | 6 |
| 9 | 20 | 20 | 10 |

From the above example 5–9, the light emitting device of the present invention was found to give white luminescence of higher intensity as compared with the light emitting device by use of non-Sic:H of the prior art, which was smaller in luminescent quantity and lower in intensity in the visible region.

Also, when life was measured for each of the light emitting devices in Examples 5–9, a life longer by one cipher as compared with that of the light emitting device of the prior art was exhibited. Also, reproducibility was found to be good and the luminescent characteristics were constantly stable in measurement of life.

EXAMPLE 10

By means of the optical CVD device shown in FIG. 17, a light emitting device having a structure as shown in FIG. 10 was prepared as described below, and characteristics test were conducted by applying a high frequency electrical field in shape of pulses from the power source 1007.

As the insulating layers 1003 and 1005, $Y_2O_3$ thin films with a thickness of 3000 Å were employed, and the luminescent layer was formed by forming the first layer region at a flow rate ratio of $C_3H_8/Si_2H_6 = 1/20$, and a total flow rate of 150 SCCM at a substrate temperature of 50° C., and the second layer region (II) at a flow rate ratio of $NH_3/Si_2H_6 = 1/1$ and a total flow rate of 90 SCCM at a substrate temperature of 50° C. This operation was performed continuously for 25 times to prepare a luminescent layer having a ultra-lattice structure comprising 25 periods of non-SiC:H/non-SiN:H. During this operation, each of the layer thickness of the first layer region (I) and the second layer region (II) was made 40 Å. As the electrode 1002, an ITO transparent electrode was employed and an Al electrode as the electrode 1006. When a high frequency electrical field in shape of pulses of 100 V, 1 KHz was applied on the thus prepared light emitting device, luminescence having a luminescent peak in the visible region of 75 ft-L was obtained. This is a value greater by 16 ciphers or more as compared with that of luminescence of the light emitting device using a non-single crystalline silicon which has been hitherto realized, thus exhibiting improvement in luminescent efficiently. Further, stability and durability of luminescent characteristics were tested by applying the above high frequency electrical field continuously over a long time. As the result, stability was more excellent by about 5-fold and durability by 1.5 cipher as compared with the above prior art example.

EXAMPLE 11

A sample was prepared according to the same procedure and under the same conditions in Example 10 except that the second layer region (II) was formed at a $Si_2F_6$ flow rate of 100 SCCM, and the periodically laminated layers of the first layer region (I) and the second layer region (II) was made 20 periods. When the same characteristic evaluation as in Example 10 was conducted for this sample, a chromogenic luminescence of 65 ft-L was obtained.

When the test of prolonged continuous repeated use was performed separately for this sample, very stable luminescent characteristics were exhibited.

EXAMPLE 12

A sample was prepared according to the same procedure and under the same conditions as in Example 10 except that the second layer region (II) was formed at a flow rate ratio of $NO/Si_2H_6 = 10$ and a total flow rate of 100 SCCM, and the periodically laminated layers of the first layer region (I) and the second layer region (II) was made 35 periods. When the same characteristic evaluation as in Example 10 was conducted for this sample, a chromogenic luminescence of 60 ft-L was obtained.

When the test of prolonged continuous repeated use was performed separately for this sample, very stable luminescent characteristics were exhibited.

EXAMPLE 13

A sample was prepared according to the same procedure and under the same conditions as in Example 10 except that the first layer region (I) was formed at a flow rate ratio of $C_3H_8/Si_2H_6 = 1/100$ and a total flow rate of 120 SCCM, and the periodically laminated layers of the first layer region (I) and the second layer region (II) was made 30 periods. When the same characteristic evaluation as in Example 10 was conducted for this sample, a chromogenic luminescence of 72 ft-L was obtained.

When the test of prolonged continuous repeated use was performed separately for this sample, very stable luminescent characteristics were exhibited.

EXAMPLE 14

By use of an ITO substrate as the substrate, a light emitting device having a structure as shown in FIG. 11 was prepared by means of the preparation device shown in FIG. 17 at a substrate temperature of 45° C. The P-type conductive layer was prepared permitting the gases into the deposition chamber at a flow rate ratio of $B_2H_6/(C_3H_8+Si_2H_6) = 10^{-2}$, a flow rate ratio of $C_3H_8/Si_2H_6 = 1/10$ and a total flow rate of 120 SCCM (diluted with hydrogen), the N-type conductive layer at a flow rate ratio of $PH_3/(C_3H_8+Si_2H_6) = 10^{-2}$ a flow rate ratio of $C_3H_8/Si_2H_6 = 1/10$ and a total flow rate of 120 SCCM (diluted with hydrogen); and the semiconductive intermediate layers (I) and (II) at a flow rate ratio of $C_3H_8/Si_2H_8 = 1/10$ and a total flow rate of 120 SCCM. Each layer was prepared by the reaction under the conditions of a pressure of 0.1 Torr and a light intensity of 40 mW/cm². The P-type conductive layer was made to have a layer thickness of 25 Å, the semiconductive intermediate layers (I) and (II) a layer thickness of 25 Å and the N-type conductive layer a layer thickness of 25 Å, and 20 periods of P layer·intermediate layer (I)·N layer·intermediate layer (II) as one unit were repeatedly laminated, followed by lamination of N layer, the intermediate layer (I) and the P layer with the above layer thicknesses.

On the upper surface of the luminescent layer thus formed, Al was vapor deposited to a thickness of 1000 Å to provide an upper electrode. The device obtained exhibited white luminescence, and its optical band gap is shown in Table 4.

EXAMPLE 15

By use of the same device and the same conditions as in Example 14, layer formation was performed by setting the substrate temperature at 20° C.

The P-type conductive layer had a layer thickness of 30 Å, the semiconductive intermediate layers (I) and (II) a layer thickness of 30 Å and the N-type conductive layer a layer thickness of 30 Å. The P layer·layer (I)·N layer·layer (II) was repeated for 20 periods. The light emitting device obtained exhibited white luminescence and its optical band gap is shown in Table 4.

EXAMPLE 16

By means of the device shown in FIG. 17 under the same conditions for preparation of corresponding layers as in Example 14, the P-type conductive layer was made to have a layer thickness of 200 Å, the intermediate layers (I) and (II) a layer thickness of 1500 Å and the N-type conductive layer a layer thickness of 200 Å, and these layer were laminated to a layer structure of P layer·layer (I) N layer·layer (II) P layer·layer (I)·N layer. The light emitting device having such a structure exhibited a chromogenic luminescence. The optical band gap of the device measured is shown in Table 4.

TABLE 4

| Example No. | Egopt [eV] | Luminescent intensity [ft · L] |
|---|---|---|
| 14 | 2.5 | 20 |
| 15 | 2.7 | 25 |
| 16 | 2.5 | 7 |

From the above examples 14–16, the light emitting device of the present invention was found to give white luminescence of higher intensity as compared with the light emitting device by use of non-Si:H of the prior art, which was smaller in luminescent quantity and lower in intensity in the visible region.

Also, when life was measured for each of the light emitting devices, a life longer by one cipher as compared with that of the light emitting device of the prior art was exhibited. Also, reproducibility was found to be good and the luminescent characteristics were constantly stable in measurement of life.

EXAMPLE 17

By means of the optical CvD device shown in FIG. 17, an light emitting device having a structure shown in FIG. 13 was prepared described below, and characteristic test was conducted by applying a high frequency electrical field in shape of pulses from the power source 1307.

As the insulating layers 1303, $Y_2O_3$ thin film with a thickness of 3000 Å was employed, and the luminescent layer was formed by use of $(C_2H_4+Si_2H_6)$ gases as a starting gas at a substrate temperature of 50° C. by use of a low pressure mercury lamp. The respective flow rates of $C_2H_4$ and $Si_2H_6$ were 80 SCCM and 40 SCCM. As the electrode 1302, an ITO transparent electrode was employed and an Al electrode as the electrode 1306. When a high frequency electrical field in shape of pulses of 100 V, 1 KHz was applied on the thus prepared light emitting device (Sample No. 1), a luminescence having a luminescent peak in the visible light region of 10 ft-L was obtained. This is a value greater by about 1 cipher or more as compared with the luminescence of the light emitting device by use of a non-single crystalline silicon which has been hitherto realized, thus exhibiting improvement of luminescent efficiency. Further, when the above the high frequency electrical field was applied continuously for a long time, for testing stability and durability of luminescent characteristics, stability was found to be more excellent by about 3-fold and durability by 1.5 cipher as compared with the prior art example.

Also, light emitting devices of Samples No. 2 and 3 were prepared in the same manner as described above except for varying the substrate temperature as shown in Table 5, and the respective characteristics were measured to obtain the results as shown in Table 5.

TABLE 5

| Sample No. | Substrate temperature (°C.) | Localized level density(cm$^{-3}\cdot$eV$^{-1}$) | Luminescent intensity |
|---|---|---|---|
| 1 | 50 | $4\times 10^{15}$ | 16 |
| 2 | 140 | $9\times 10^{15}$ | 8 |
| 3 | 300 | $3\times 10^{16}$ | 4 |

EXAMPLE 18

Figure 16:
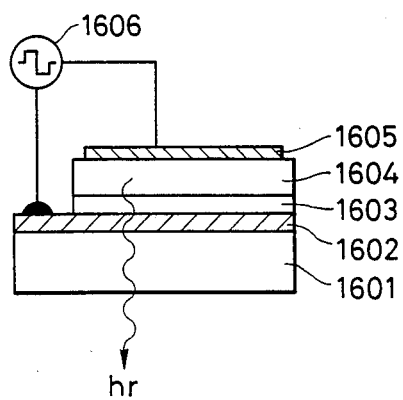

By means of the optical CVD device shown in FIG. 17, an light emitting device having a structure as shown FIG. 16 was prepared as described below, and characteristics test were conducted by applying a high frequency electrical field in shape of pulses from the power source 1607.

As the insulating layer 1603, $Y_2O_3$ thin films with a thickness of 3000 Å were employed, and the luminescent layer was formed by forming the first layer region at a flow rate ratio of $C_3H_8/Si_2H_6=1/20$ and a total flow rate of 150 SCCM at a substrate temperature of 50° C. and the second layer region (II) at a flow rate ratio of $NH_3Si_2H_6=1/1$ and a total flow rate of 90 SCCM at a substrate temperature of 50° C. This operation was performed continuously for 25 times prepare a luminescent layer having a ultra-lattice structure comprising 25 periods of non-SiC:H/non-SiN:H. During this operation, each of the layer thickness of the first layer region (I) and the second layer region (II) was made 40 Å. As the electrode 1602, an ITO transparent electrode was employed and Al electrode as the electrode 1606. When a high frequency electrical field in shape of pulses of 100 V, 1 KHz was applied on the thus prepared light emitting device, luminescence having a luminescent peak in the visible region of 60 ft-L was obtained. This is a value greater by 1.6 ciphers or more as compared with that of luminescence of the light emitting device using a non-single crystalline silicon which has been hitherto realized, thus exhibiting improvement in luminescent efficiency. Further, stability and durability of luminescent characteristics were tested by applying the above high frequency electrical field continuously of a long time. As the result, stability was more excellent by about 5-fold and durability by 1.5 cipher as compared with the above prior art example.

EXAMPLE 19

A sample was prepared according to the same procedure and under the same conditions as in Example 18 except that the second layer region (II) was formed at a flow rate ratio of $NH_3/Si_2H_6=1/1$ and a total flow rate of 100 SCCM, and the periodically laminated layers of the first layer region (I) and the second layer region (II) was made 30 periods. When the same characteristic evaluation as in Example 18 was conducted for this sample, a chromogenic luminescence of 50 ft-L was obtained.

When the test of prolonged continuous repeated use was performed separately for this sample, very stable luminescent characteristics were exhibited.

EXAMPLE 20

A sample was prepared according to the same procedure and under the same conditions as in Example 18 except that the second layer region (II) was formed at a flow rate ratio of $NO/Si_2H_6=10$ and a total flow rate of 100 SCCM, and the periodically laminated layers of the first layer region (I) and the second layer region (II) was made 35 periods. When the same characteristic evaluation as in Example 18 was conducted for this sample, a chromogenic luminescence of 48 ft-L was obtained.

When the test of prolonged continuous repeated use was performed separately for this sample, very stable luminescent characteristics were exhibited.

EXAMPLE 21

A sample was prepared according to the same procedure and under the same conditions as in Example 18 except that the first layer region (I) was formed at a flow rate ratio of $C_3H_8/Si_2H_6=1/100$ and a total flow rate of 120 SCCM, and the periodically laminated layers of the first layer region (I) and the second layer region (II) was made 30 periods. When the same characteristic evaluation as in Example 18 was conducted for this sample, a chromogenic luminescence of 58 ft-L was obtained.

When the test of prolonged continuous repeated use was performed separately for this sample, very stable luminescent characteristics were exhibited.

We claim:

1. A light emitting device comprising: (a) a luminescent layer having at least two layers laminated to each other, the thickness of each laminated layer being approximately the De Broglie wavelength of the carrier or about the mean free path of the carrier; (i) each layer comprising a non-single crystalline material containing silicon atoms, carbon atoms and hydrogen atoms and (ii) having a homo-junction at the interface of said layers, and (b) at least a pair of electrodes connected electrically to said luminescent layer, and each of said non-single crystalline silicon layers having an optical band gap of at least 2.0 eV and a localized level density at mid-gap of no more than $5\times 10^{16}$ cm$^{-3}\cdot$eV$^{-1}$.

2. A light emitting device according to claim 1, wherein said luminescent layer has a layer constitution in which a P-type conductive layer and an N-type conductive layer are laminated.

3. A light emitting device according to claim 1, wherein said luminescent layer has a layer constitution in which a P-type conductive layer, a layer containing no impurity of P-type and N-type and an N-type conductive layer are laminated.

4. A light emitting device according to claim 1, wherein said luminescent layer has a layer constitution in which a P-type conductive layer, an I-type conductive layer and an N-type conductive layer are laminated.

5. A light emitting device according to claim 1, wherein the quantum efficiency of the luminescent layer is $10^{-4}$% or higher.

6. A light emitting device comprising a luminescent layer comprising a non-single crystalline material containing silicon atoms, carbon atoms and hydrogen atoms, the thickness of the luminescent layer being approximately the De Broglie wavelength of the carrier or about the means free path of the carrier, a pair of electrically insulating layers having said luminescent layer sandwiched therebetween and at least a pair of electrodes electrically connected to said luminescent layer and insulating layers having said luminescent layer and said insulating layer sandwiched therebetween, said luminescent layers having an optical band gap of at least 2.0 eV and a localized level density at mid-gap of no more than $5 \times 10^{16}$ cm$^{-3} \cdot$eV$^{-1}$.

7. A light emitting device comprising a luminescent layer having a layer constitution of a p-type conductive layer, a semiconductor intermediate layer and an N-type conductive layer, and at least a pair of electrodes electrically connected to said luminescent layer, at least one layer of the three layers constituting said luminescent layer having a multi-layer structure in which a first layer region comprising a non-single crystalline material containing silicon atoms, carbon atoms and hydrogen atoms and a second layer region different in optical band gap from said first layer region are laminated as a pair and plurality of said pairs are laminated as a unit within said at least one layer the thickness of each laminated layer being approximately the De Broglie wavelength of the carrier or about the mean free path of the carrier.

8. A light emitting device according to claim 7, wherein said first layer region has I-type conductive characteristics.

9. A light emitting device according to claim 7, wherein said first layer region contains no impurity of P-type and N-type.

10. A light emitting device according to claim 7, wherein said second layer region has an optical band gap greater than that of the first layer region.

11. A light emitting device according to claim 7, wherein the quantum efficiency of the luminescent layer is $10^{-4}\%$ or higher.

12. A light emitting device comprising a pair of electrically insulating layers having a luminescent layer sandwiched therebetween, and at least a pair of electrodes electrically connected to said luminescent layer and said insulating layers having said luminescent layer and said insulating layers sandwiched therebetween, said luminescent layer having a multi-layer structure in which a first layer region comprising a non-single crystalline material containing silicon atoms, carbon atoms and hydrogen atoms and a second layer region different in optical band gap from said first layer region are laminated as a pair and a plurality of said pairs are laminated as a unit within said luminescent layer, the thickness of each laminated layer being approximately the De Broglie wavelength of the carrier or about the means free path of the carrier.

13. A light emitting device according to claim 12, wherein the optical band gap of said first layer region is at least 2.0 eV.

14. A light emitting device according to claim 12, wherein the localized level density at mid gap of said first layer region is no more than $5 \times 10^{16}$ cm$^{-3} \cdot$eV$^{-1}$.

15. A light emitting device comprising a luminescent layer having a layer structure in which an N-type conductive layer, a first semiconductor intermediate layer (I), a p-type conductive layer and a second semiconductive intermediate layer (II) are laminated in this order, the thickness of each laminated layer being approximately the De Broglie wavelength of the carrier or about the mean free path of the carrier, and at least a pair of electrodes connected electrically to said luminescent layer, said luminescent layer comprising a non-single crystalline material containing silicon atoms, carbons atoms and hydrogen atoms, and said material having an optical band gap of at least 2.0 eV and a localized level density at mid-gap of no more than $5 \times 10^{16}$ cm$^{-3} \cdot$eV$^{-1}$.

16. A light emitting device according to claim 15, wherein at least one of said first semiconductive intermediate layer (I) and said second semiconductive intermediate layer (II) have I-type conductive characteristics.

17. A light emitting device according to claim 15, wherein at least one of said first semiconductive intermediate layer (I) and said second semiconductive intermediate layer (II) contain no impurity of P-type and N-type.

18. A light emitting device according to claim 15, wherein said layer structure is periodic.

19. A light emitting device according to claim 15, wherein the quantum efficiency of the luminescent layer is $10^{-4}\%$ or higher.

20. A light emitting device comprising a luminescent layer comprising a non-single crystalline material containing silicon atoms, carbon atoms and hydrogen atoms, the thickness of the luminescent layer being approximately the De Broglie wavelength of the carrier or about the means free path of the carrier, an electrically insulating layer superposed on said luminescent layer and at least a pair of electrodes electrically connected to said luminescent layer and said insulating layer having said luminescent layer and said insulating layer sandwiched therebetween, said luminescent layer having an optical band gap of at least 2.0 eV and a localized level density at mid-gap of no more than $5 \times 10^{16}$ cm$^{-3} \cdot$eV$^{-1}$.

21. A light emitting device comprising a luminescent layer, an electrically insulating layer superposed on said luminescent layer and at least a pair of electrodes electrically connected to said luminescent layer and said insulating layer having said luminescent layer and said insulating layer sandwiched therebetween, said luminescent layer having a multi-layer structure in which a first layer region comprising a non-single crystalline material containing silicon atoms, carbon atoms and hydrogen atoms and a second layer region different in optical band gap from said first layer region are laminated as a pair and a plurality of said pairs are laminated as a unit within said luminescent layer, the thickness of the luminescent layer being approximately the De Broglie wavelength of the carrier or about the mean free path of the carrier.

22. A light emitting device according to claim 21, wherein the optical band gap of said first layer region is at least 2.0 eV.

23. A light emitting device according to claim 21, wherein the localized level density at mid gap of said first layer region is $5 \times 10^{16}$ cm$^{-3} \cdot$ev or less.

* * * * *

UNITED STATES PATENT AND TRADEMARK OFFICE
CERTIFICATE OF CORRECTION

PATENT NO. : 4,914,490  Page 1 of 4
DATED : April 3, 1990
INVENTOR(S) : Takasu et al.

It is certified that error appears in the above-identified patent and that said Letters Patent is hereby corrected as shown below:

COLUMN 1:

Line 28, "homo-junc-" should read -- homojunc- --.

Line 31, "(non doped) layer)" should read --(non-doped) layer--.

Line 42, "luminesence" should read --luminescence--.

Line 65, "illustration" should read --illustrations--.

Line 66, "consitution" should read --constitution--.

COLUMN 5:

Line 10, "electrode 402" should read --transparent electrode 402--.

COLUMN 6:

Line 4, "sd" should read --so--.

Line 27, "second region (II) 602" should read --second layer region (II) 602--.

COLUMN 8:

Line 9, "less." should read --less,--.

UNITED STATES PATENT AND TRADEMARK OFFICE
CERTIFICATE OF CORRECTION

PATENT NO. : 4,914,490

DATED : April 3, 1990

INVENTOR(S) : Takasu et al.

It is certified that error appears in the above-identified patent and that said Letters Patent is hereby corrected as shown below:

COLUMN 9:

Line 54, "intermediate II" should read --intermediate layer II--.

COLUMN 10:

Line 43, "electical" should read --electrical--.

COLUMN 11:

Line 40, "thorough" should read --through--.

COLUMN 12:

Line 41, "Theses" should read --These--.

COLUMN 13:

Line 37, "$-(CH_3)_2SiH_2,$" should read --$(CH_3)_2SiH_2,$--.

COLUMN 14:

Line 48, "non-dope layer" should read --non-doped layer--.

UNITED STATES PATENT AND TRADEMARK OFFICE
CERTIFICATE OF CORRECTION

PATENT NO. : 4,914,490
DATED : April 3, 1990
INVENTOR(S) : Takasu et al.

It is certified that error appears in the above-identified patent and that said Letters Patent is hereby corrected as shown below:

COLUMN 16:

Line 13, "food" should read --good--.

COLUMN 17:

Line 67, "example 5-9," should read --Examples 5-9--.

COLUMN 18:

Line 2, "non-Sic:H" should read --non-SiC:H--.

Line 42, "luminescent efficiently." should read --luminescent efficiency.--.

COLUMN 20:

Line 10, "layer·layer(I) N" should read --layer·layer(I)·N--.

Line 37, "optical CvD device" should read --optical CVD device--.

COLUMN 22:

Line 33, "homo-junction" should read --homojunction--.

Line 61, "means" should read --mean--.

UNITED STATES PATENT AND TRADEMARK OFFICE
CERTIFICATE OF CORRECTION

PATENT NO. : 4,914,490

DATED : April 3, 1990

INVENTOR(S) : Takasu et al.

It is certified that error appears in the above-identified patent and that said Letters Patent is hereby corrected as shown below:

<u>COLUMN 23</u>:

Line 5, "semiconductor intermediate layer" should read --semiconductive intermediate layer--.

Line 45, "means" should read --mean--.

Line 51, "mid gap" should read --mid-gap--.

Line 55, "semiconductor intermediate layer" should read --semiconductive intermediate layer--.

<u>COLUMN 24</u>:

Line 4, "carbons atoms" should read --carbon atoms--.

Line 59, "is $5 \times 10^{16} cm^{-3}$ eV or less." should read --is no more than $5 \times 10^{16} cm^{-3}$ eV.--

Signed and Sealed this

Tenth Day of December, 1991

Attest:

HARRY F. MANBECK, JR.

*Attesting Officer*  *Commissioner of Patents and Trademarks*